United States Patent
Han et al.

(10) Patent No.: US 6,424,044 B1
(45) Date of Patent: Jul. 23, 2002

(54) USE OF BORON CARBIDE AS AN ETCH-STOP AND BARRIER LAYER FOR COPPER DUAL DAMASCENE METALLIZATION

(75) Inventors: Licheng M. Han; Xu Yi; Joseph Zhifeng Xie; Mei Sheng Zhou; Simon Chooi, all of Singapore (SG)

(73) Assignees: Chartered Semiconductor Manufacturing Ltd.; Institute of Microelectronics, both of Singapore (SG)

(*) Notice: Subject to any disclaimer, the term of this patent is extended or adjusted under 35 U.S.C. 154(b) by 0 days.

(21) Appl. No.: 10/050,697

(22) Filed: Jan. 18, 2002

Related U.S. Application Data

(62) Division of application No. 09/619,377, filed on Jul. 19, 2000, now Pat. No. 6,352,921.

(51) Int. Cl.[7] .............................................. H01L 23/48
(52) U.S. Cl. ........................................ 257/758; 257/775
(58) Field of Search ................................ 438/637, 638, 438/634, 687, 622; 257/758, 775, 774

(56) References Cited

U.S. PATENT DOCUMENTS

| | | | |
|---|---|---|---|
| 5,348,894 A | 9/1994 | Gnade et al. | |
| 5,658,834 A | 8/1997 | Dowben | 438/478 |
| 5,817,572 A | 10/1998 | Chiang et al. | 438/624 |
| 5,851,896 A | 12/1998 | Summerfelt | 438/396 |
| 6,358,842 B1 * | 3/2002 | Zhou et al. | 438/596 |
| 6,362,091 B1 * | 3/2002 | Andideh et al. | 438/624 |

\* cited by examiner

Primary Examiner—Tuan H. Nguyen
(74) Attorney, Agent, or Firm—George O. Saile; Rosemary L. S. Pike; Sevgin Oktay

(57) ABSTRACT

A method of forming a boron carbide layer for use as a barrier and an etch-stop layer in a copper dual damascene structure, and the structure itself are disclosed. In addition to providing a good barrier to copper diffusion, good insulating properties, high etch selectivity with respect to dielectric insulators, boron carbide also provides good electrical characteristics because of its low dielectric constant of less than 5. The amorphous boron carbide is formed in a PECVD chamber by introducing a boron source gas such as $B_2H_6$, $B_5H_{9+}$, and carbon source gas such as $CH_4$ and $C_2H_6$ at a deposition temperature of about 400° C. Any one, or any combination of the passivation, etch-stop, cap layers of the damascene structure can comprise boron carbide.

13 Claims, 4 Drawing Sheets

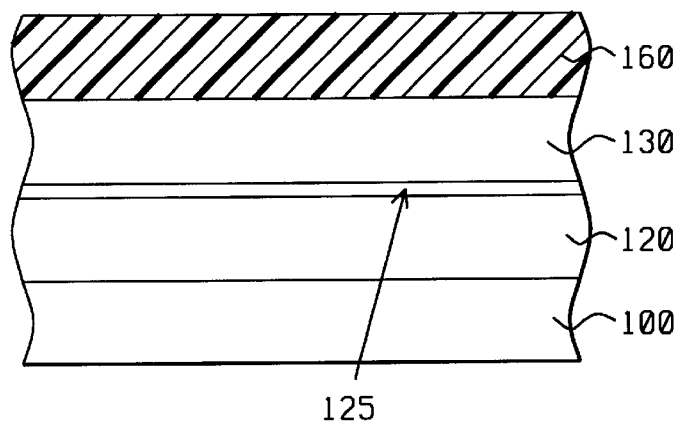
FIG. 1a – Prior Art
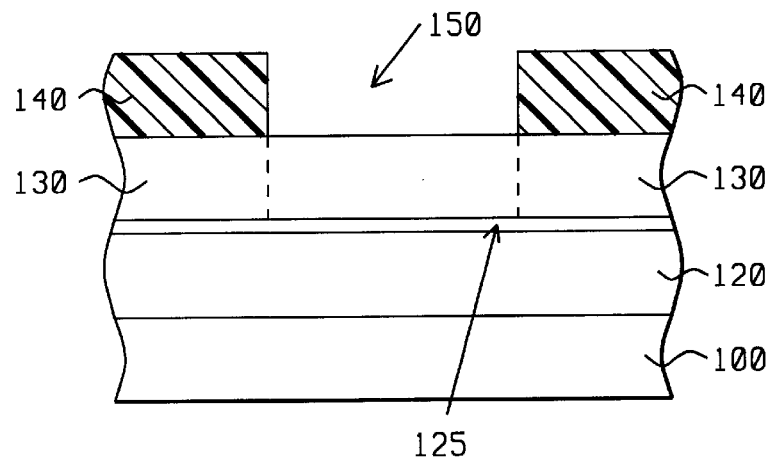
FIG. 1b – Prior Art
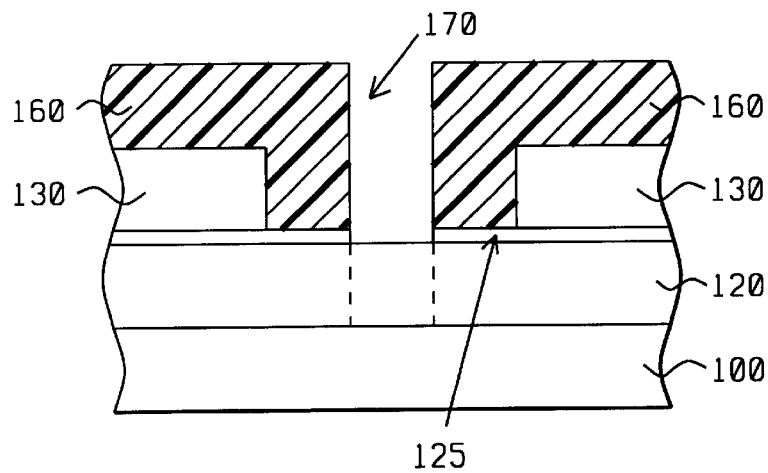
FIG. 1c – Prior Art

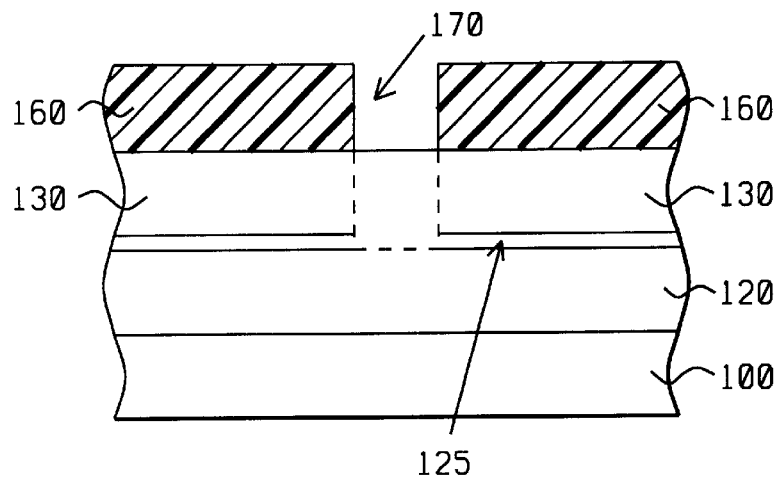
FIG. 1d – Prior Art
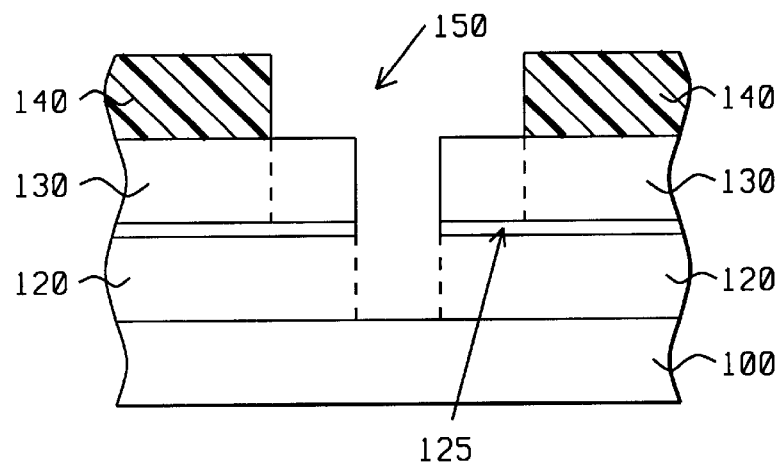
FIG. 1e – Prior Art
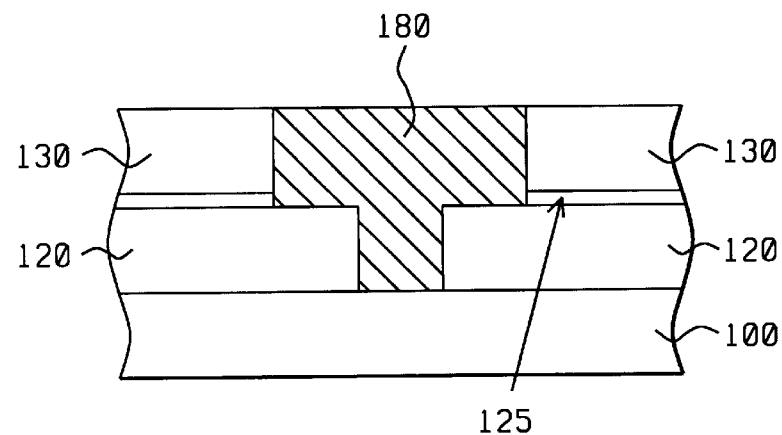
FIG. 1f – Prior Art

USE OF BORON CARBIDE AS AN ETCH-STOP AND BARRIER LAYER FOR COPPER DUAL DAMASCENE METALLIZATION This is a division of patent application Ser. No. 09/619,377, filing date Jul. 19, 2001, now U.S. Pat. No. 6,352,921, Use Of Boron Carbide As An Etch-Stop And Barrier Layer For Copper Dual Damascene Metallization, assigned to the same assignee as the present invention.

BACKGROUND OF THE INVENTION (1) Field of the Invention

The present invention relates to the manufacture of ultra large scale integrated (ULSI) circuit chips in general, and in particular, to the use of and a method of using PECVD boron carbide as an etch-stop and barrier layer for copper dual damascene metallization.

(2) Description of the Related Art

Copper dual damascene process is a well-known technique for forming interconnections in semiconductor devices. It is especially well suited for Ultra Large Scale Integrated (ULSI) circuit technology where more and more devices are being packed into the same or smaller areas in a semiconductor substrate. As the feature sizes get smaller, the smaller geometries result in higher electrical resistances, which in turn degrade circuit performance. As will be described more fully later, damascene process provides a more exact dimensional control over small geometries, while copper, as the metallization material, provides better electrical characteristics. It is disclosed in the present invention the use of, and a method of using, PECVD boron carbide as an etch-stop and barrier layer in a copper dual damascene structure in order to improve the performance of integrated circuit (IC) device.

The term 'damascene' is derived from a form of inlaid metal jewelry first seen in the city of Damascus. In the context of integrated circuits it implies a patterned layer imbedded on and in another layer such that the top surfaces of the two layers are coplanar. Thus, in semiconductor manufacturing, grooves and holes in appropriate locations in the grooves are formed in an insulating material by etching, which are then filled with metal. Metal in grooves form the horizontal metal line interconnects while the metal in the underlying holes form the vertical connections to the layers of metal interconnects formed in the previous damascene structure.

Thus, in a single damascene semiconductor manufacturing process, incisions, or grooves, are formed in an insulating layer and filled with metal to form conductive lines. Dual damascene takes the process one step further in that, in addition to forming the grooves of a single damascene, hole openings are also formed at appropriate places in the groove further into the insulating layer. The resulting composite structure of grooves and holes are filled with metal. The process is repeated as many times as required to form the multi-level interconnections between metal lines and the holes formed therebetween.

In one approach for a dual damascene process shown in FIG. 1a, two insulating layers (120) and (130) are formed on a substrate (100) with an intervening etch-stop layer (125). A desired trench or groove pattern (150) is first etched into the upper insulating material (130) using conventional photolithographic methods and photoresist (140). The etching stops on etch-stop layer (125). Next, a second photoresist layer (160) is formed over the substrate, thus filling the groove opening (150), and patterned with hole opening (170), as shown in FIG. 1b. The hole pattern is then etched into the lower insulating layer (120) as shown in FIG. 1c and photoresist removed, thus forming the dual damascene structure shown in FIG. 1f.

Or, the order in which the groove and the hole are formed can be reversed. Thus, the upper insulating layer (130) is first etched, or patterned, with hole (170), as shown in FIG. 1d. The hole pattern is also formed into etch-stop layer (125). Then, the upper layer is etched to form groove (150) while at the same time the etching transfers the hole pattern in the etch-stop layer into lower insulation layer (120), as shown in FIG. 1e. It will be noted that the etch-stop layer stops the etching of the groove into the lower insulation layer. After the completion of the thusly formed dual damascene structure, both the hole opening and groove opening are filled with metal (180), and any excess material on the surface of the substrate is removed by chemical mechanical polishing, as seen in FIG. 1f.

The metal that is commonly used as the damascene interconnect is aluminum because of its refined properties for etchability, as will be known to those skilled in the art. However, since copper has better electromigration property and lower resistivity than aluminum, it is a more preferred material for wiring than aluminum. By the same token, copper unfortunately suffers from high diffusivity in common insulating materials such as silicon oxide and oxygen-containing polymers. For instance, copper tends to diffuse into polyimide during high temperature processing of the polyimide. This causes severe corrosion of the copper and the polyimide due to the copper combining with oxygen in the polyimide. The corrosion may result in loss of adhesion, delamination, voids, and ultimately a catastrophic failure of the component. A copper diffusion barrier is therefore often required. It is disclosed later in the embodiments of the present invention that PECVD boron carbide or tantalum nitride is a preferred diffusion barrier layer.

It is also disclosed in the present invention that boron carbide is preferred as an etch-stop layer for its lower dielectric constant. Conventionally, silicon nitride (SiN) is used as a etch-stop layer. However, PECVD silicon nitride tends to be nonstoichiometric, while LPCVD nitride exhibits high tensile stresses, causing cracks for films greater that about 2000 Å. Silicon nitride also exhibits outgassing which result in voids and, therefore, reliability problems. Furthermore, etch rates for silicon nitride are relatively fast so that for relatively low selectivity of silicon nitride to oxides in general, nitride layers must be thick. This results in cracks. More importantly, silicon nitride has a dielectric constant of about 7. It is desirable to use materials with lower dielectric constants as etch-stop layers, because they become a composite part of the interconnect, and hence affect the effective dielectric constant of the total composite structure, which affects the electrical characteristics of the device.

In prior art, a method for forming interconnections for semiconductor fabrication and semiconductor devices are described. In U.S. Pat. 5,817,572, Chiang, et al., a first patterned dielectric layer is formed over a semiconductor substrate and has a first opening filled with conductive material. Another patterned dielectric layer is formed over the first dielectric layer and has a second opening over at least a portion of the conductive material The first patterned dielectric layer serves as an etch-stop in patterning the other patterned dielectric layer. Also, a dielectric etch-stop layer is formed over the first patterned dielectric layer and over the conductive material before the other patterned dielectric layer has been formed. This dielectric etch-stop layer serves as an etch-stop in patterning the other patterned dielectric layer. The second opening exposes a portion of die dielectric etch-stop layer. The exposed portion of the dielectric etch-stop layer is removed. The second opening is filled with conductive material.

In another U.S. Pat. No. 5,658,834, Dowben describes active semiconductor devices including heterojunction diodes and thin film transistors, which are formed by PECVD deposition of a boron carbide thin film on an N-type substrata. The boron to carbon ratio of the deposited material is controlled so that the film has a suitable band gap energy. The stoichiometry of the film can be selected by varying the partial pressure of precursor gases, such as nido pentaborane and methane.

Summerfelt, in U.S. Pat. No. 5,851,896, on the other hand, shows a conductive exotic-nitride barrier layer for high-dielectric-constant material electrodes. An embodiment of this invention comprises an oxidizable layer (e.g. TiN), a conductive exotic-nitride barrier layer (e.g. Ti—Al—N) overlying the oxidizable layer, an oxygen stable layer (e.g. platinum) overlying the exotic-nitride layer, and a high-dielectric-constant material layer (e.g. barium strontium titanate) overlaying the oxygen stable layer. The exotic-nitride barrier layer substantially inhibits diffusion of oxygen to the oxidizable layer, thus minimizing deleterious oxidation of the oxidizable layer.

In still another U.S. Patent, Gnade, et al., disclose a different method of forming electrical connections to high dielectric constant materials. An embodiment of this invention comprises an oxidizable layer (e.g. tantalum), an oxygen gettering layer (e.g. platinum/tantalum mixture) overlaying the oxidizable layer, a noble metal layer (e.g. platinum) overlaying the oxygen gettering layer, and a high-dielectric-constant material layer (e.g. barium strontium titanate) overlaying the noble metal layer. The structures presented provide electrical connection to high-dielectric-constant. The oxygen gettering layer controls oxygen diffusion, minimizing the formation of a resistive layer either in the lower electrode or at the lower electrode/substrate interface. The oxygen gettering layer acts as a gettering site for oxygen, where the oxygen oxidizes the reactive metal portion of the layer, leaving the noble metal portion of the layer intact. The invention provides a stable and electrically conductive electrode for high-dielectric-constant materials while using standard integrated circuit materials to facilitate and economize the manufacturing process.

In the present invention, a method of forming a boron carbide layer for use as a barrier and an etch-stop layer in a copper dual damascene structure, and the structure itself are disclosed.

SUMMARY OF THE INVENTION

It is therefore an object of this invention to provide a method of forming a copper dual damascene structure having a boron carbide etch-stop layer with a low dielectric constant.

It is another object of this invention to provide a method of forming a copper dual damascene structure having a boron carbide layer as a barrier to copper diffusion.

It is still another object of the present invention to provide a copper dual damascene structure having boron carbide layers with effective low dielectric constant, good copper diffusion barrier, good insulating properties and high etching selectivity with respect to insulating layers.

It is an over-all object of the present invention to provide a damascene structure wherein one or more of the passivation, etch-stop, and cap layer, or combination barrier and passivation layer are formed of boron carbide.

These objects are accomplished by providing a semiconductor substrate having a first conductive layer; forming a boron carbide (BC) passivation layer over said conductive layer; forming a first dielectric layer over said BC passivation layer; forming a BC etch-stop layer over said first dielectric layer; forming a second dielectric layer over said BC etch-stop layer; forming a BC cap layer over said second dielectric layer; forming a first photoresist layer over said cap layer and patterning said photoresist layer with a mask comprising a via hole pattern; etching through said via pattern in said first photoresist layer to form said via hole in said BC cap layer and said second dielectric layer until said BC etch-stop layer is reached; etching through said via hole pattern to form said via hole in said BC etch-stop layer; etching further said via hole pattern into said first dielectric layer until BC passivation layer is reached; removing said first photoresist layer; forming a second photoresist layer over said BC cap layer including said via hole in said second dielectric layer; patterning said second photoresist layer with a mask comprising a line trench pattern; etching through said line trench pattern in said second photoresist layer into said BC cap layer and said second dielectric layer and into said BC etch-stop layer; etching further through said hole pattern in said BC etch-stop layer and extending said hole pattern into said BC passivation layer thus forming a dual damascene structure comprising a composite hole and line trench pattern in said substrate; removing said second photoresist layer; forming a barrier lining on the inside walls of said dual damascene structure; forming metal over said barrier lining in said dual damascene structure; and forming a combination barrier and passivation layer over said substrate including over said dual damascene structure.

These objects are accomplished in a second embodiment providing a semiconductor substrate having a substructure comprising devices formed in said substrate and a conductive layer formed thereon; a boron carbide (BC) passivation layer over said conductive layer; a first dielectric layer over said first BC passivation layer; a BC etch-stop layer over said first dielectric layer; a second dielectric layer over said BC etch-stop layer; a BC cap layer over said second dielectric layer; a dual damascene structure having a top portion and inside walls formed within first and second dielectric layers; said dual damascene structure having a barrier layer lining said inside walls; and said dual damascene structure having a combination barrier and etch stop layer over said top portion.

BRIEF DESCRIPTION OF THE DRAWINGS

FIGS. 1a–1c show the forming of a dual damascene structure where a line trench or groove is etched first into an upper second dielectric layer until an etch-stop layer is reached, and then the hole pattern etched into the lower first dielectric layer, according to prior art.

FIGS. 1d–1e show the forming of a dual damascene structure where a hole pattern is etched first into an upper second dielectric layer until an etch-stop layer is reached, and then the line pattern etched into the top layer while at the same time the hole pattern is transferred into the lower first dielectric layer, according to prior art.

FIG. 1f shows a dual damascene structure formed by either one of the methods shown in FIGS. 1a–1c or FIGS. 1d–1e, according to prior art.

DESCRIPTION OF THE PREFERRED EMBODIMENTS

Referring now the drawings, in particular to FIGS. 2a–2f, there is shown a copper dual damascene process utilizing boron carbide as an etch-stop layer.

Figure 2A:
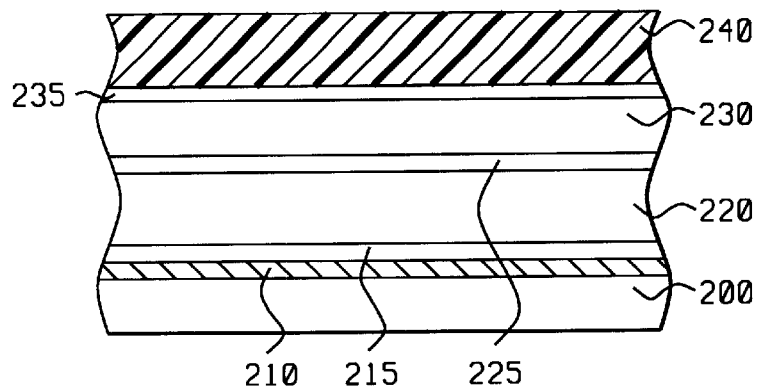
FIG. 2a is a partial cross-sectional view of a substrate showing the forming of a first and a second dielectric layer separated from each other by an intervening second etch-stop layer while being separated from the substrate by a first etch-stop layer, according to the present invention.
Figure 2B:
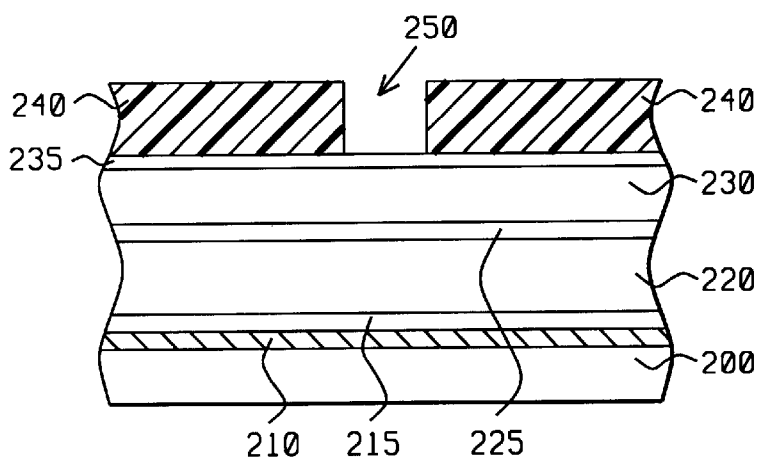
FIG. 2b is a partial cross-sectional view of a substrate showing the patterning of a photoresist layer with a hole pattern over the substrate of FIG. 2a, according to the present invention.

Specifically, FIG. 2a shows a semiconductor substrate (200) having a conductive layer (210) thereover. Semiconductor substrate should be understood to include a substrate or wafer composed of a semiconductor material such s silicon, or silicon-on-sapphire (SOS) or silicon-on-insulator (SOI) as is known in the art. Semiconductor substrate should be understood to possibly further include one or more layers of insulating material and/or conductive material an one or more active and/or passive devices and/or multilayer interconnection structure over the active and/or passive devices, formed in or over the substrate or the like. The conductive layer (210) can comprise one or more conductors from a group coating copper, tungsten, aluminum, titanium, titanium nitride, tantalum, tantalum nitride. Typically, the conductive layer is an interconnect pattern or line. In the present invention, the conductor is preferred to comprise copper and barrier metal and may be in the form of a dual or single damascene structure or a blanket film. Boron carbide (BC) is grown over the conductor layer or substrate using the technique of plasma enhanced chemical vapor deposition or physical vapor deposition (PVD). This BC is a main feature and key aspect of the present invention because, unlike the conventional etch-stop layers such as PECVD silicon nitride, for example, it has a low dielectric constant, is a good barrier to copper diffusion, has good insulating properties, and high etch selectivity with respect to dielectric materials which are used as insulating layers. Furthermore, through careful control of the growth conditions, amorphous BC can be grown having specific mechanical and electrical properties suited for specific applications.

Thus, a passivation layer of BC, in FIG. 2a, is formed over the underlying conductive layer (210) by introducing boron source gas and carbon source gas in a CVD chamber at a deposition temperature between about 100 to 450° C. yielding a dielectric constant between about 3 to 6. Preferably, the source gases for boron and carbon includes but not restricted to $B_2H_6$, $B_5H_9$ and $CH_4$, $C_2H_6$, respectively. The ratio of the flow rates of the boron source gas to the carbon source gas is between 1:1000 and 1000:1. One or more carrier gases from a group containing nitrogen, argon and helium can also be used in addition to the boron source gas and the carbon source gas. The pressure for the deposition is between 10 mTorr and 10 Torr. In the case that RF is applied (that is, in a PECVD chamber), the frequency used is about 13.56 MHz and the RF power that is capacitively coupled to the plasma is between about 110 to 250 watts. And the preferred thickness of the BC is between about 50 to 5000 Å. Alternatively, boron carbide can be deposited by physical vapor deposition on a magnetron sputtering equipment using a graphite target and a boron source gas (including but not restricted to $B_2H_6$, $B_5H_6$, $B_5H_9$). Main sputtering parameters are: power between about 1 kW and 10 kW, magnetic field between about 50 Gauss to 300 Gauss, temperature between about 20° C. to 500° C., pressure between about 0.1 mTorr to 1000 mTorr.

Next, first dielectric layer (220) is formed over the BC passivation layer. As is well known in the art, blanket dielectric layers may be formed from materials including but not limited to undoped and doped silicon oxide materials, organic polymers and porous and non-porous entities of the aforementioned materials formed within integrated circuits through methods including but not limited to CVD, PVD sputtering, and spincoating methods. For the preferred embodiment of the present invention, the blanket first dielectric layer has a thickness between about 2000 to 10000 Å.

A second boron carbide layer is next formed over the first dielectric layer as an etch-stop layer, as shown in the same FIG. 2a. Preferably, second BC layer (225) is formed using the method described above to a thickness between about 50 to 5000 Å, and it is important that it has the same dielectric constant as the first BC layer.

The next layer of dielectric, (230), shown in FIG. 2a is a second dielectric layer that is formed above layer (225). The second dielectric layer preferably has a thickness between about 2000 to 10000 Å, and is preferably the same as the first dielectric layer (220). Finally, a cap layer (235) comprising typically of silicon nitride is deposited over the second dielectric layer to a thickness between about 500 to 5000 Å. The cap layer can also be comprised of boron carbide, which has the same dielectric constant as the first BC layer. The cap layer functions as an effective stop layer for CMP, and has a thickness between about 50 to 5000 Å.

Figure 2C:
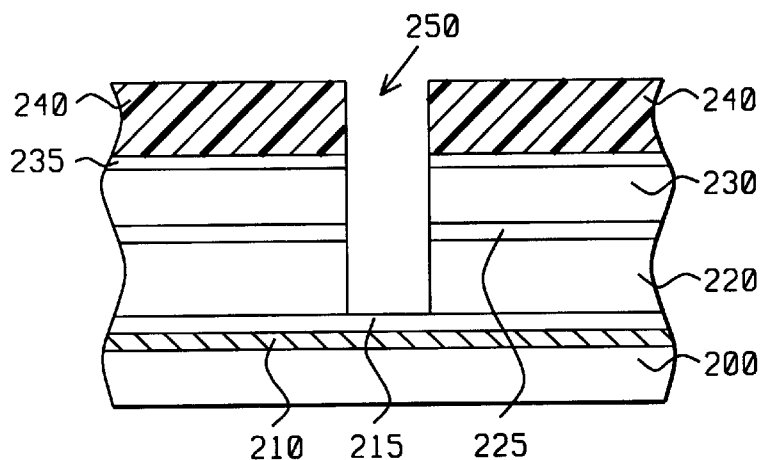
FIG. 2c is a partial cross-sectional view of a substrate showing the etching of the hole pattern of FIG. 2b into the second and first dielectric layers, according to the present invention.

Using conventional techniques, first photoresist layer (240) is next formed over the second dielectric layer and then patterned with the image of a via or a contact hole. Using photoresist layer (240) as a mask, hole pattern (250) is then etched into the cap second and first dielectric layers, in that order, including the intervening BC layer (225) as shown in FIG. 2c. The etching of the dielectric layers is accomplished using plasma-assisted dry etching wherein etching chemistry comprises one or more gas from a group containing fluorocarbon(s), fluorine-substituted hydrocarbon(s), fluorosulfur, hydrocarbon(s), fluorine, chlorine, chlorine-substituted hydrocarbon(s), nitrogen, hydrogen, forming gas, argon, carbon monoxide and oxygen, while the etching of the BC cap layer and etch stop layer is accomplished using plasma-assisted dry etching wherein etching chemistry comprises one or more gases from a group containing nitrogen, hydrogen, forming gas, fluorine, chlorine, oxygen and argon.

Figure 2D:
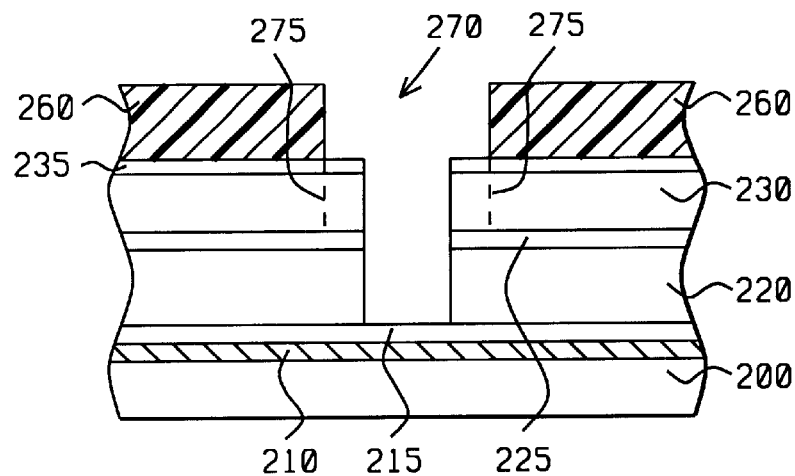
FIG. 2d is a partial cross-sectional view of a substrate showing the patterning of a photoresist layer with a line pattern over the substrate of FIG. 2c, according to the present invention.
Figure 2E:
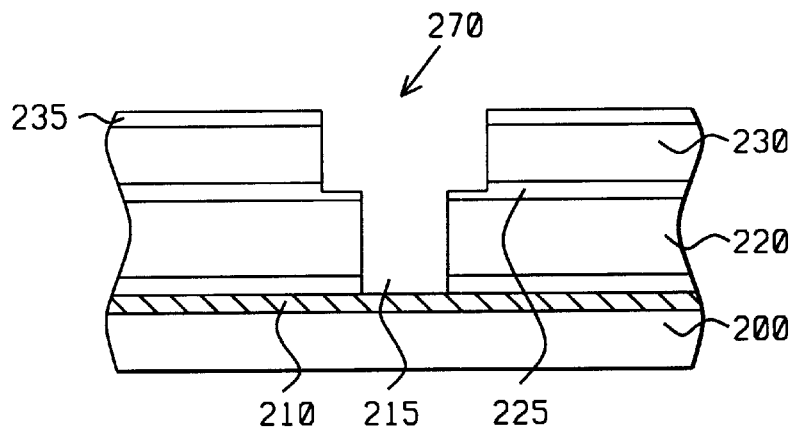
FIG. 2e is a partial cross-sectional view of a substrate showing the etching of the line pattern in the second dielectric layer into the second etch-stop layer of FIG. 2d, while at the same time etching the hole pattern in the first dielectric layer into the first etch-stop layer, according to the present invention.

Next, the first photoresist layer is removed, preferably by wet stripping or oxygen plasma ashing, although the first photoresist layer may also be removed during the etching if oxygen is used as one of the etching gases. A second photoresist layer (260) formed over the substrate, including the opening formed in the previous step, and patterned with the image of a line trench to form groove (270) as shown in FIG. 2d. The line pattern is next transferred from the second photoresist layer into the second dielectric layer by using plasma-assisted dry etching wherein etching chemistry comprises one or more gases from a group containing fluorocarbons(s), fluorine-substituted hydrocarbons(s), fluorosulfur, hydrocarbons(s), nitrogen, hydrogen, forming gas, argon, carbon monoxide and oxygen, first stopping on etch-stop layer (225) as shown by phantom lines (275). After removal of the second photoresist layer, the hole pattern in the first dielectric layer is transferred into the passivation layer (215), as shown in FIG. 2e. This is accomplished with plasma-assisted dry etching wherein etching chemistry comprises one or more gas from a group containing nitrogen, hydrogen, forming gas, fluorine, chlorine, $O_2$ and Ar having high etching selectivity with respect to exposed copper or silicon.

Figure 2F:
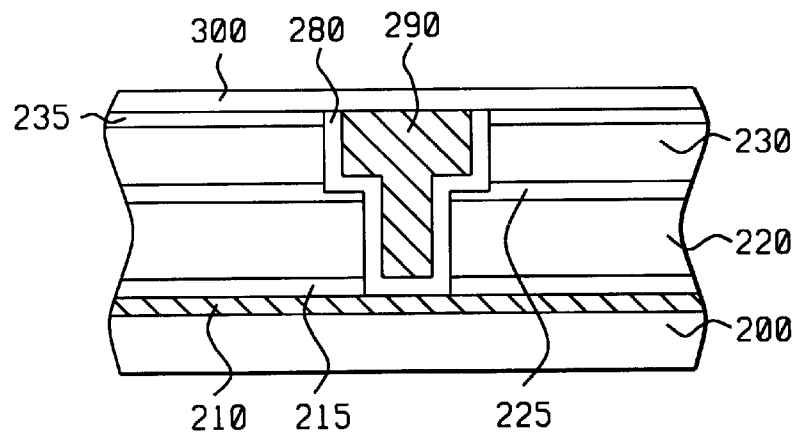
FIG. 2f is a partial cross-sectional view of a substrate showing the forming of a barrier lining in the composite line and hole structure of FIG. 2e, and the completion of the dual damascene structure of this invention.

As another important step in the present invention, the composite line/hole structure shown in FIG. 2e is lined with a material which forms a good barrier to copper diffusion. It is preferred that barrier lining (280) comprises tantalum or tantalum nitride formed by PVD or CVD, and having a thickness between about 50 to 2000 Å. Next, the composite structure is filled, preferably, with copper (290) or other conductor such as aluminum deposited to a thickness between about 4000 to 10000 Å and the excess metal is removed by chemical mechanical polishing, which is commonly used for planarizing surfaces. Finally, the copper damascene structure of the invention is completed by forming still another layer (300) of boron carbide having a thickness between about 50 to 5000 Å over the substrate to serve as a top barrier lid or passivation layer for the copper interconnect, or as an etch-stop layer for the next level of metallization as shown in FIG. 2f.

It will be apparent to those skilled in the art that, the passivation layer, the etch-stop layer, and the cap layer, namely the disclosed BC layers become integrated into the disclosed copper damascene interconnect, and hence contribute to an over-all smaller effective dielectric constant than would otherwise be. In addition to having a lower dielectric constant than, for example, the commonly used silicon nitride, boron carbide also has good qualities as a barrier to copper diffusion. Thus, BC can also be used as barrier layer (280) for the copper damascene interconnect shown in FIG. 2f. Though numerous details of the disclosed method are set forth here, such as these processes and process parameters, to provide an understanding of the present invention, it will be obvious, however, to those skilled in the art that these specific details need not be employed to practice the present invention. At the same time, it will be evident that the same methods may be employed in other similar process steps that are too many to cite, such as the forming of passivation layer, etch-stop and cap layer as well as barrier layers comprising the disclosed BC, and also, the forming of not only dual or multi-damascene structures, but to single damascene structures as well. Furthermore, the dual damascene structure which is constructed in the present invention using the "trench-first" approach can also be constructed using the "via-first" approach or other known approaches, as it will be understood by those skilled in the art.

While the invention has been particularly shown and described with reference to the preferred embodiments thereof, it will be understood by those skilled in the art that various changes in form and details may be made without departing from the spirit and scope of the invention.

What is claimed is:

1. A dual damascene structure with boron carbide etch-stop and barrier layers comprising:

provide a semiconductor substrate having a substructure comprising devices formed in said substrate and a conductive layer formed thereon;

a boron carbide (BC) passivation layer over said conductive layer;

a first dielectric layer over said BC passivation layer;

a BC etch-stop layer over said first dielectric layer;

a second dielectric layer over said BC etch-stop layer;

a BC cap layer over said second dielectric layer;

a dual damascene structure having a top portion and inside walls formed within first and second dielectric layers;

said dual damascene structure having a barrier layer lining said inside walls; and said dual damascene structure having a combination barrier and etch stop layer over said top portion.

2. The dual damascene structure of claim 1, wherein said BC passivation layer, said BC cap layer, said BC etch-stop layer are formed in a CVD chamber by introducing boron source gas and carbon source gas at a deposition temperature between about 100 to 450° C.

3. The dual damascene structure of claim 2, wherein said boron source gas comprises $B_2H_6, B_5H_9$ and carbon source gas comprises $CH_4, C_2H_6$.

4. The dual damascene structure of claim 2, wherein said BC passivation layer, said BC etch-stop layer and said BC cap layer are formed using physical vapor deposition (PVD) with a graphite target and a boron source gas.

5. The dual damascene structure of claim 1, wherein said BC passivation layer has a thickness between about 50 to 5000 Å.

6. The dual damascene structure of claim 1, wherein said first dielectric layer comprises undoped silicon dioxide, doped silicon dioxide, organic polymers and porous combination thereof.

7. The dual damascene structure of claim 1, wherein said first dielectric layer has a thickness between about 2000 to 1000 Å.

8. The dual damascene structure of claim 1, wherein said BC etch-stop layer has a thickness between about 50 to 5000 Å.

9. The dual damascene structure of claim 1, wherein said second dielectric layer has a thickness between about 2000 to 10000 Å.

10. The dual damascene structure of claim 1, wherein said barrier lining comprises tantalum nitride or tantalum.

11. The dual damascene structure of claim 1, wherein said barrier lining has a thickness between about 50 to 2000 Å.

12. The dual damascene structure of claim 1, wherein said combination barrier and etch-stop layer comprises boron carbide formed in a PECVD chamber by introducing boron source gas and carbon source gas at a deposition temperature between about 100 to 450° C.

13. A damascene structure with boron carbide layers comprising:

a semiconductor substrate having a conductive layer formed thereon;

a passivation layer formed over said conductive layer;

a dielectric layer formed over said passivation layer;

an etch-stop layer formed over said first dielectric layer;

a second dielectric layer formed over said etch-stop layer;

a damascene cavity formed within said first and second dielectric layers, including therethrough intervening said etch-stop layer;

said damascene cavity having a top edge portion and inside walls;

a barrier layer lining said inside walls;

a combination barrier and passivation layers over said top edge portion; and wherein one or more of said passivation, etch-stop, cap layer or combination barrier and passivation layer is formed of boron carbide.

* * * * *

UNITED STATES PATENT AND TRADEMARK OFFICE
CERTIFICATE OF CORRECTION

PATENT NO. : 6,424,044 B1 Page 1 of 1
DATED : July 23, 2002
INVENTOR(S) : Licheng M. Han, Yi Xu, Joseph Zhifeng Xie, Mei Sheng Zhou amd Simon Chooi It is certified that error appears in the above-identified patent and that said Letters Patent is hereby corrected as shown below:

<u>Title page,</u>
Item [75], please delete "Xu Yi", and replace with -- Yi Xu --.

Signed and Sealed this

Twenty-fourth Day of December, 2002

JAMES E. ROGAN
*Director of the United States Patent and Trademark Office*